United States Patent
Shigehara et al.

(10) Patent No.: US 6,415,078 B1
(45) Date of Patent: *Jul. 2, 2002

(54) LASER LIGHT SOURCE AND MANUFACTURING METHOD THEREFOR

(75) Inventors: Masakazu Shigehara; Masayuki Shigematsu; Takashi Kato, all of Kanagawa (JP)

(73) Assignee: Sumitomo Electric Industries, Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/633,522

(22) Filed: Apr. 17, 1996

(30) Foreign Application Priority Data

Apr. 17, 1995 (JP) ............................................. 7-090561

(51) Int. Cl.$^7$ ................................................. G02B 6/34
(52) U.S. Cl. ............................. 385/37; 385/85; 385/88
(58) Field of Search .................... 385/85, 80, 77–78, 385/37, 88–94; 372/6, 96

(56) References Cited

U.S. PATENT DOCUMENTS

| | | | | |
|---|---|---|---|---|
| 4,299,490 A | * | 11/1981 | Cahill et al. ................. | 356/350 |
| 4,725,110 A | * | 2/1988 | Glenn et al. ................... | 385/37 |
| 4,783,132 A | | 11/1988 | Gordon .................... | 350/96.19 |
| 4,786,132 A | * | 11/1988 | Gordon ........................ | 385/38 |
| 4,805,976 A | * | 2/1989 | Wilkening et al. ............. | 385/84 |
| 5,280,172 A | * | 1/1994 | Di Bin et al. .......... | 250/227.21 |
| 5,351,324 A | * | 9/1994 | Forman ........................ | 385/37 |
| 5,359,689 A | | 10/1994 | Iwatsuka et al. .............. | 385/73 |
| 5,367,589 A | * | 11/1994 | MacDonald et al. .......... | 385/37 |
| 5,384,884 A | * | 1/1995 | Kashyap et al. ............. | 385/129 |
| 5,463,709 A | * | 10/1995 | Terao et al. ................... | 385/85 |
| 5,469,520 A | * | 11/1995 | Morey et al. ................. | 385/37 |
| 5,485,481 A | * | 1/1996 | Ventrudo et al. ............... | 372/6 |
| 5,691,999 A | * | 11/1997 | Ball et al. ..................... | 372/20 |

FOREIGN PATENT DOCUMENTS

| | | |
|---|---|---|
| EP | 0 635 736 | 1/1995 |
| WO | 94/17448 | 8/1994 |

OTHER PUBLICATIONS

Patent Abstracts of Japan, vol. 010, No. 334 (P–515) Nov. 13, 1986 & JP–A–61 138217 (Mitsushita Electric Ind Co Ltd), Jun. 25, 1986.
Patent Abstracts of Japan, vol. 011, No. 335 (P–632), Nov. 4, 1987 & JP–A–62 119508 (Nippon Hoso Kyokai; Others: 01), May 30, 1987.
Patent Abstracts of Japan, vol. 015, No. 273 (E–1088), Jul. 11, 1991 & JP–A–03 093285 (Matsushita Electric Ind Co Ltd), Apr. 18, 1991.
Bird, "Narrow Line Semiconductor Laser Using Fibre Grating", Electronics Letters, vol. 27, No. 13, Jun. 20, 1991, pp. 1115–1116.
Midgley et al, "Reduction of Optical–Feedback–Induced Frequency Noise in Pigtailed Laser Diodes", Electronics Letters, vol. 25, No. 13, Jun. 22, 1989, pp. 863–864.
Electronics letters, vol. 27, No. 13, pp. 1115–1116, Jun. 20, 1991.

* cited by examiner

*Primary Examiner*—Ellen E. Kim
(74) *Attorney, Agent, or Firm*—McDermott, Will & Emery

(57) ABSTRACT

In a method of manufacturing a laser light source according to the present invention, an optical fiber having a diffraction grating is produced in which a plurality of refractive index changing portions are formed along the direction of an optical axis of the optical fiber. Then, the optical fiber having the diffraction grating is inserted into a ferrule, the optical fiber is bonded thereat, and the end surface of the ferrule is ground. Further, a laser oscillating device is prepared, and the laser oscillating device is coupled with the optical fiber having the diffraction grating and being inserted in the ferrule.

19 Claims, 5 Drawing Sheets

LASER LIGHT SOURCE AND MANUFACTURING METHOD THEREFOR

BACKGROUND OF THE INVENTION

1. Field of the Invention

The present invention relates to a method of manufacturing a laser light source as a light source of optical application products such as light communication, optical fiber amplifiers, and the like.

2. Description of the Related Art

Conventionally, there has known a laser light source manufacturing method disclosed in Electron. Lett., Vol. 27, No. 13, pp. 1,115 to 1,116, 1991, D. M. Bird et al. According to this method, standard single-mode optical fibers are connected to opposite ends of an optical fiber type diffraction grating respectively, and the end surface of one of the optical fibers is lens-finished.

There is another example of the laser light source manufacturing method disclosed in the international publication WO94/17488 by Raman KASHYAP. This technique comprises a first step of preparing a semiconductor laser having an output facet and a back facet disposed at its opposite ends to constitute an oscillator; a second step of lens-finishing the forward end of an optical fiber; a third step of coupling light emitted from the semiconductor laser with the optical fiber; and a fourth step of radiating interference light of ultraviolet rays through a window opened in a package storing the semiconductor laser and the optical fiber to thereby form a diffraction grating area having a plurality of refractive index changing portions in the core of the optical fiber along the direction of its optical axis.

In the conventional method by D. M. Bird et al. described above, there is a problem that the optical fiber having a diffraction grating has a mechanical connection point, so that it is low in strength as well as in reliability.

In the example of the method disclosed in the above international publication WO94/17488 by Raman KASHYAP, the optical fiber type diffraction grating area is formed after the optical fiber is fixed to the semiconductor laser mechanically so that faults arising in manufacturing the optical fiber type diffraction grating can produce corresponding faults in the laser light source as a whole.

Generally, the cost associated with producing a device constituting a laser light source (hereinafter referred to as "laser oscillating device") other than an optical fiber type diffraction grating is considerably higher than the cost associated with producing the optical fiber type diffraction grating.

However a high-level technique is required for manufacturing an optical fiber type diffraction grating capable of at a reflecting light of desired Bragg wavelength, and the success rate thereof is generally considerably lower than that of manufacturing a laser oscillating device.

SUMMARY OF THE INVENTION

It is an object of the present invention to provide a method of manufacturing a laser light source having a high reliability with a high success rate.

In a method of manufacturing a laser light source according to the present invention, an optical fiber having a diffraction grating is produced in which a plurality of refractive index changing portions are formed along the direction of an optical axis of the optical fiber. The optical fiber having the diffraction grating is inserted into a ferrule, the optical fiber is bonded to the ferrule, and the end surface of the ferrule is ground. A laser oscillating device is prepared, and the laser oscillating device is coupled with the optical fiber having the diffraction grating and being inserted in the ferrule.

The present invention provides a laser light source and a manufacturing method thereof with a high success rate by adopting a method where an optical fiber type diffraction grating (which typically has the lowest success rate of manufacturing when manufactured with other components of a laser light source), is manufactured separately from the laser oscillating device so that only one product is connected to the laser oscillating device.

In addition, the present invention provides a laser light source and a manufacturing method thereof with a high reliability by adopting a structure where a portion having the diffraction grating of the optical fiber is received in a ferrule so as to reinforce the optical fiber type diffraction grating and to make the handling thereof easy. As a result, it is easy to provide a minute inclination relative to the optical fiber end surface. Accordingly, it is possible to eliminate reflected light on the end surface of the optical fiber to thereby reduce noise.

DETAILED DESCRIPTION OF THE INVENTION

Detailed description of the present invention will be described referring to the accompanying drawings as follows.

In the method of manufacturing a laser light source according to the present invention, an optical fiber type diffraction grating is used as one of a pair of mirrors of an oscillator. A considerably high-level technique is required for manufacturing this optical fiber type diffraction grating. Accordingly, the rate of good products manufactured is not high in general.

Figure 1:
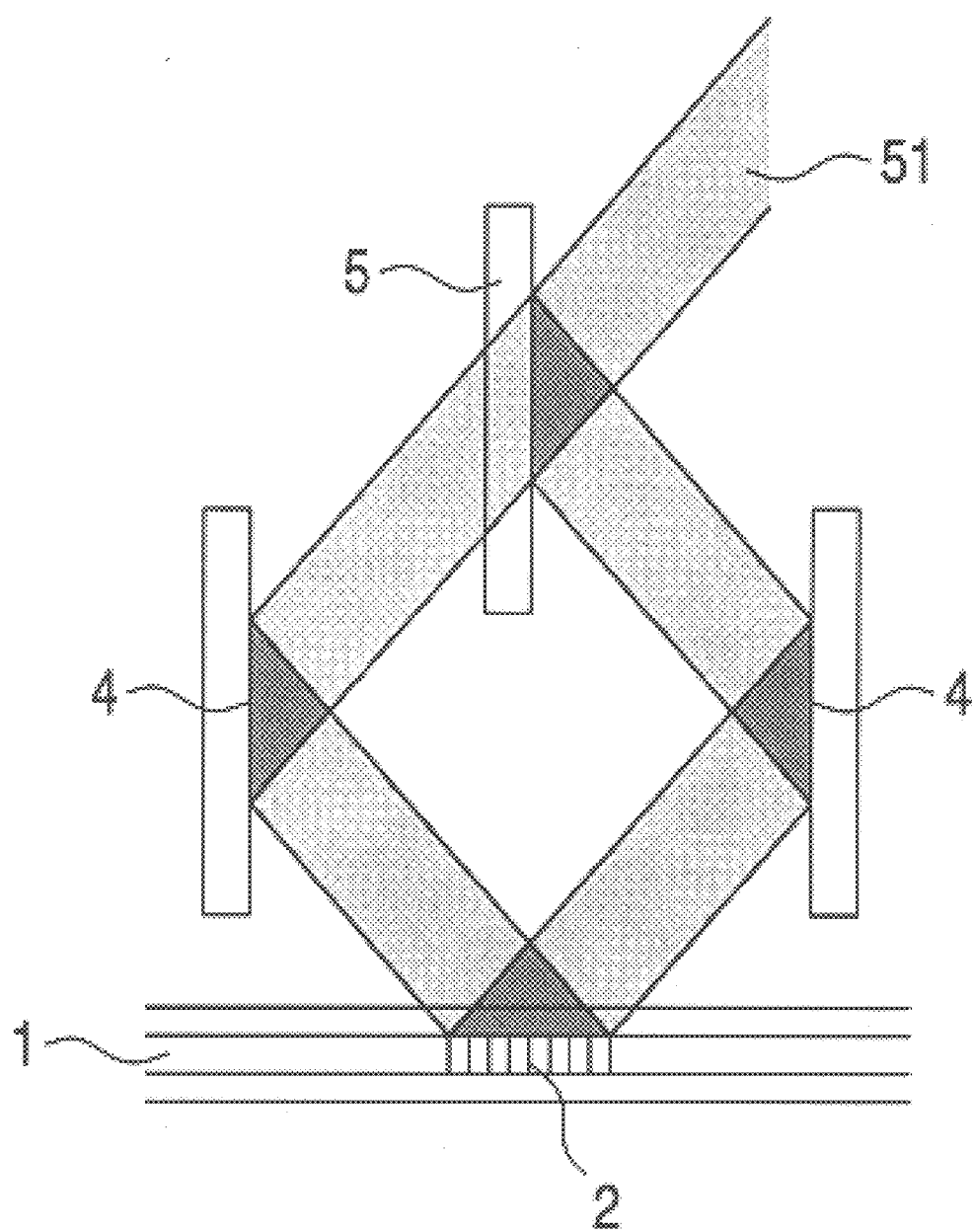
FIG. 1 is a diagram showing a method of forming a diffraction grating in an optical fiber.

For example, in a method as shown in FIG. 1, coherent interference fringes of ultraviolet rays are generated by a holographic interference method and radiated onto an optical fiber 1 containing germanium oxide. In this method, it is necessary that a pencil of parallel coherent ultraviolet rays is first radiated onto a beam splitter 5 so as to be separated into two pencils of light rays, and the directions of the respective pencils of light rays are adjusted by mirrors 4 so that the respective pencils of light rays are radiated onto the optical fiber 1 containing germanium oxide while keeping an accurate relationship of supplementary angles. However, a considerably high-level of accuracy is required for this method. In addition, in order to make an optical fiber type diffraction grating 2 manufactured by this method generate a reflected light having a predetermined so-called Bragg wavelength, it is necessary to satisfy an effective refractive index of the optical fiber and a predetermined radiation angle so as to satisfy so-called Bragg's conditions shown in the following expression:

$$\lambda_B = 2n\Lambda$$

where:

$\lambda_B$ is Bragg wavelength;

n is an effective refractive index of an optical fiber; and $\Lambda$ is a period of refractive index changing portions. Although it is clear in theory, providing the bragg wavelength requires a considerable number of trials and errors in practice.

Therefore, if a process to provide the laser oscillating device and a process to provide the optical fiber type diffraction grating 2 are performed separately, it is possible to improve the success rate for manufacturing good, and acceptable laser light sources.

In addition, since an optical fiber containing a diffraction grating area is inserted, bonded, fixed and reinforced to a so-called ferrule 11 which is a connection part to an optical fiber in the present invention, it is extremely easy to connect the optical fiber to the laser oscillating device optically and mechanically. Further, since the optical fiber type diffraction grating is reinforced by the ferrule, its end surface can be finished easily. Moreover, it is easy to slightly incline the face direction of the end surface of the ferrule relative to the direction perpendicular to the optical axis, so that unnecessary reflected light can be eliminated and the performance can be improved.

Since ultraviolet rays are radiated on an optical fiber to form a diffraction grating after the optical fiber is installed on a laser oscillating device in the conventional method (International Publication, WO94/17488), Bragg-reflected light cannot be measured directly and only the light transmitted through the optical fiber type diffraction grating can be measured. On the other hand, in the present invention, since an optical fiber type diffraction grating is manufactured in a separate step, the Bragg wavelength and reflection factor can be measured directly and good products can be selected accurately.

Embodiments of the present invention will be described below in detail. The same parts are referenced correspondingly in the description of the various embodiments, and the description of the parts that are present in more than one embodiment is not repeated for each of the embodiments.

A first embodiment will be described. FIG. 1 shows a first step where interference fringes of ultraviolet rays 51 are radiated onto an optical fiber 1 so as to manufacture an optical fiber type diffraction grating 2.

An optical fiber type diffraction grating is manufactured by radiating coherent interference fringes of ultraviolet rays 51 onto an optical fiber containing germanium oxide so as to form refractive index changing portions where the refractive index changes periodically in the direction of the optical axis. In this case, in order to generate desired longitudinal-mode Bragg wavelength $\lambda_B$, it is necessary to form a refractive index changing portion with a period $\Lambda$ satisfying the above-mentioned expression on the assumption of effective refractive index n of the optical fiber.

Figure 2A:
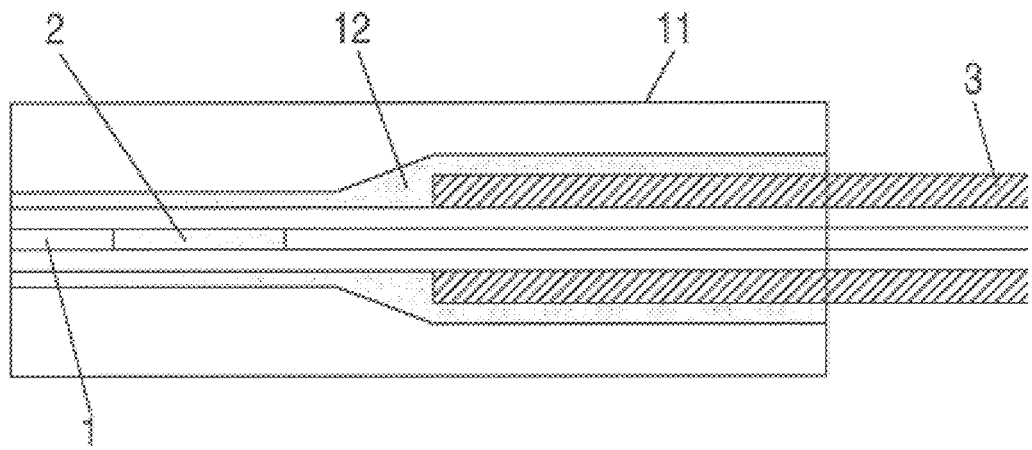
FIG. 2A shows the positional relationship between the ferrule and the diffraction grating area in the optical fiber in the case where oscillator length is set short.
Figure 2B:
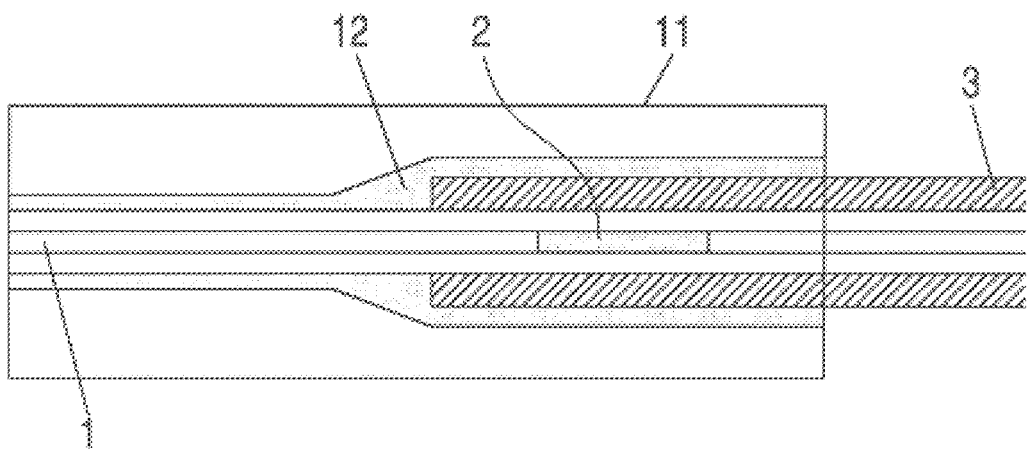
FIG. 2B shows the positional relationship between the ferrule and the diffraction grating area in the optical fiber in the case where oscillator length is set long.

Next, as a second step, the optical fiber 1 containing this diffraction grating 2 is inserted into and fixed to a ferrule 11. FIGS. 2A and 2B are longitudinal sectional views showing the state where the optical fiber 1 containing the diffraction grating 2 is inserted into and fixed to the ferrule 11.

First, the optical fiber 1 containing the diffraction grating 2 is coated with a resin coating 3 so as to be reinforced mechanically. By this process, it is possible to avoid troubles such as breaking of the optical fiber during insertion and the like.

The outer diameter of the optical fiber is 125 μm while the inner diameter of a thin hole of the top end portion of the ferrule is 126 μm so that the gap therebetween is set to only 1 μm to promote accurate positioning. It is therefore impossible to insert the optical fiber into this portion unless the optical fiber is bare. Therefore, as shown in FIGS. 2A and 2B, a predetermined length of the protective coating of the top end portion of the optical fiber is removed so that the diffraction grating area can be set in a predetermined position in accordance with a desired oscillator length.

Particularly in the case where it is necessary to reduce the distance between the optical fiber type diffraction grating 2 and a back facet 27 of a semiconductor laser 21, that is, the oscillator length, a method in which resin coating of the diffraction grating area is separated or only portions other than the diffraction grating area is coated with a resin coating in advance may be adopted in order to insert the diffraction grating area of the optical fiber at its top end portion deeply, as shown in FIG. 2A.

Next, the top end portion of the optical fiber is coated with a bonding agent 12, inserted into and fixed to the ferrule 11.

As for the ferrule 11 used in this embodiment, the whole length is set to 25 mm, the outer diameter is set to 3 mm, the inner diameter of the thin hole of the top end portion is set to 126 μm as mentioned above, and the inner diameter of the inner hole of the back is set to 1 mm. Stainless steel is used as the material of the ferrule 11 however, it is understood that any desired plastics may be used.

Last, the optical fiber in the top end portion of the ferrule is ground and finished into a mirror surface. The longitudinal section in this state is shown in FIG. 2B. By this process, the optical fiber type diffraction grating 2 is reinforced to make the following steps easy in handling.

Figure 3:
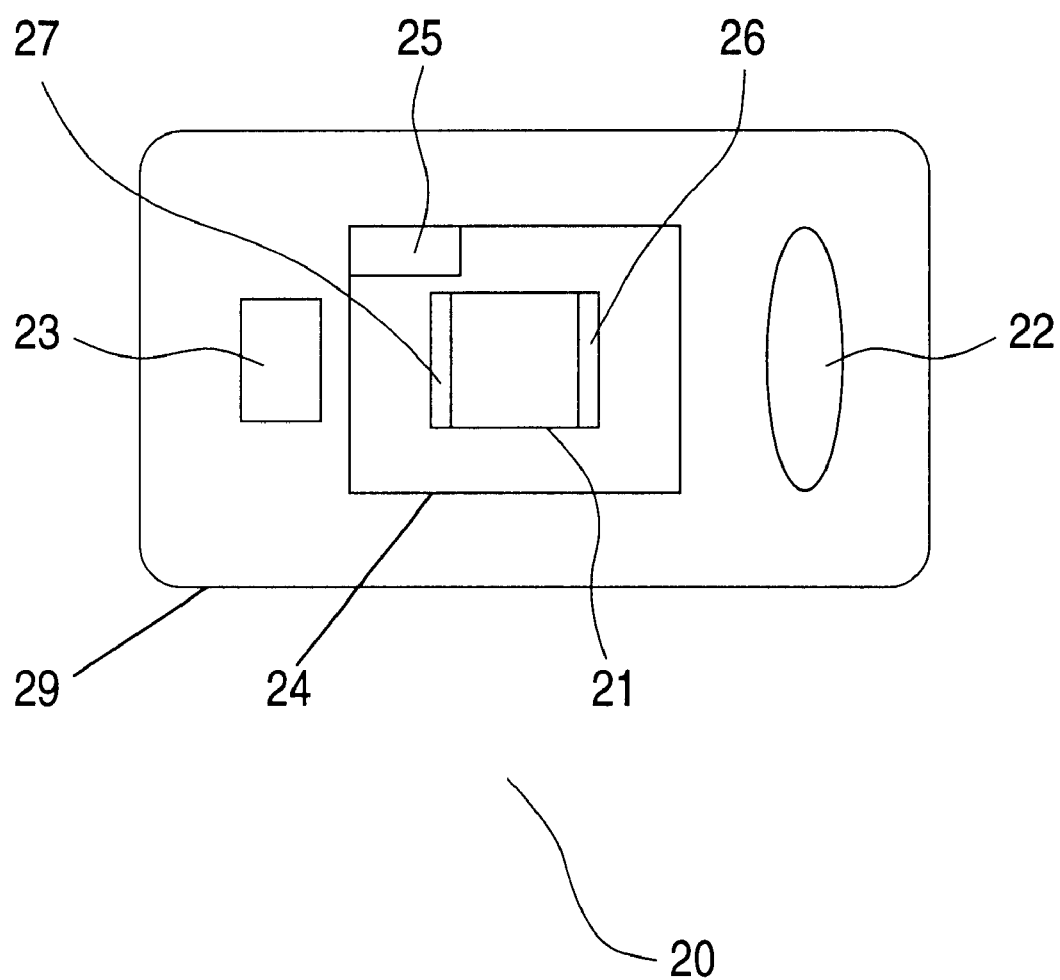
FIG. 3 is a diagram showing a laser oscillating device which constitutes a part of a laser light source according to the present invention.

As a third step, a laser oscillating device 20 is prepared. FIG. 3 is a top view schematically showing the laser oscillating device 20. This oscillating device includes a semiconductor laser 21 as a device for generating light. This semiconductor laser 21 has an output facet 26 having a reflection factor of 20% and a transmission factor of 80% on its end surface in the light existing direction, and a back facet 27 having a reflection factor of 70% and a transmission factor of 30% on its other end surface. The reason why the reflection factor of the output facet has a low value of only 20% is to form an oscillator between the optical fiber type diffraction grating and the back facet 27 having a reflection factor of 70%, effectively.

Figure 4A:
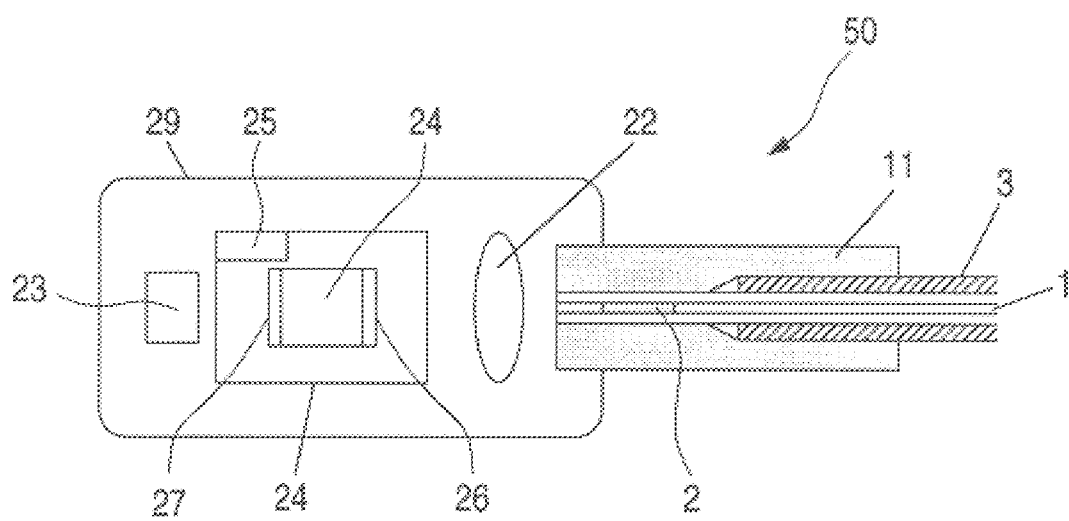
FIG. 4A is a top sectional view showing the state where the optical fiber having the diffraction grating area and inserted into the ferrule has been optically and mechanically connected to the laser oscillating device in a laser light source according to the present invention.

A monitoring photodiode 23 provided at the rear of the semiconductor laser 21 is to measure the output of a laser light source 50 shown FIG. 4A manufactured by the manufacturing method according to the present invention when the laser light source 50 is used, the measurement being performed by detecting light transmitted from the back facet 27.

The temperature of heat generated from the semiconductor laser 21 is measured by a temperature detector 25 such as a thermistor or the like, so that the semiconductor laser 21 is maintained at a temperature within a predetermined range by a cooling device 24 such as a cooler, or the like, that uses Peltier effect to thereby protect the semiconductor laser 21 thermally.

A lens 22 having a function to focus light flux emitted from the semiconductor laser 21 onto the top end portion of the optical fiber having a diffraction grating and received in the ferrule is provided in front of the output facet 26 of the semiconductor laser 21. This lens is not limited to a one-piece convex lens, but may be an optics constituted by a plurality of lenses so long as the optics serves as a convex lens.

The laser oscillating device 20 is received in a protective case 29 for protecting these constituent parts mechanically. Thus, the laser oscillating device 20 is completed.

Figure 4B:
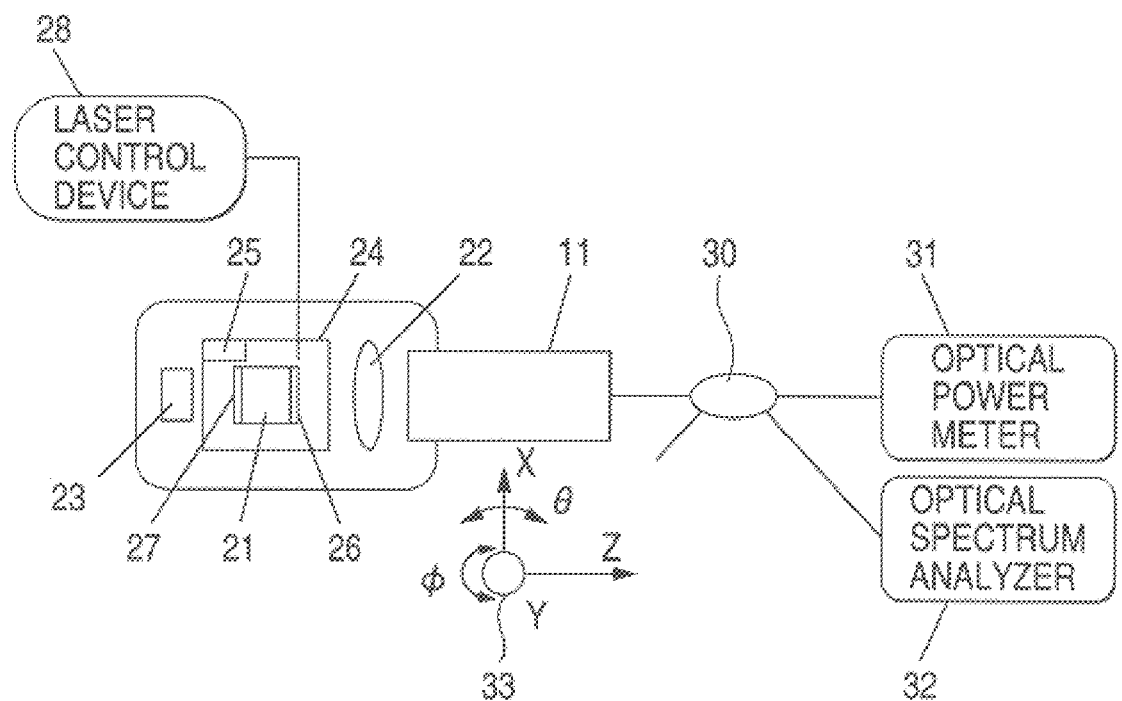
FIG. 4B is a diagram showing a method by which the optical fiber having the diffraction grating area is connected to the laser oscillating device in the optically optimum position.

As a fourth step, the laser oscillating device 20 is optically and mechanically connected to the optical fiber 1 having a diffraction grating and received in the ferrule 11. FIG. 4A is a top sectional view showing the state where the laser oscillating device is optically and mechanically connected to the optical fiber type diffraction grating in a laser light source according to the present invention. FIG. 4B is a schematic drawing showing a method by which the laser oscillating device 20 and the diffraction grating 2 inserted into the ferrule are optically connected to each other in an optimum position and mechanically fixed with each other. A laser control device 28 is provided to control the output, the temperature, and the like, of the laser light source 50 in use.

First, as for the optical connection, the laser oscillating device and the optical fiber having the diffraction grating and received in the ferrule are connected to each other mechanically temporarily, and then the laser oscillating device is actuated so that the position where the light output becomes maximum is searched for.

Consideration of the position where the laser oscillating device is to be set relative to the optical fiber should not be restricted to the position where the light output takes a maximum value is not sufficient. Accordingly, an optical power meter 31 and an optical spectrum analyzer 32 are connected to the emission end of the aforementioned optical fiber through a light coupler 30 to search for the position where the output of light having the desired Bragg wavelength takes a maximum value. In this case, a positioning fine adjustment device 33 is used for searching for this position. This fine adjustment device 33 is designed so that its parallel displacement in the direction of the three axes of x, y and z, and its rotational axis can be controlled.

After the confirmation of this position, the laser oscillating device and the aforementioned ferrule are welded and fixed by using YAG laser. Further, a package is applied if necessary thereto.

It is possible to connect the laser oscillating device to the ferrule with a bonding agent or the like in the case where a ferrule adaptor is provided on the laser oscillating device.

Figure 5A:
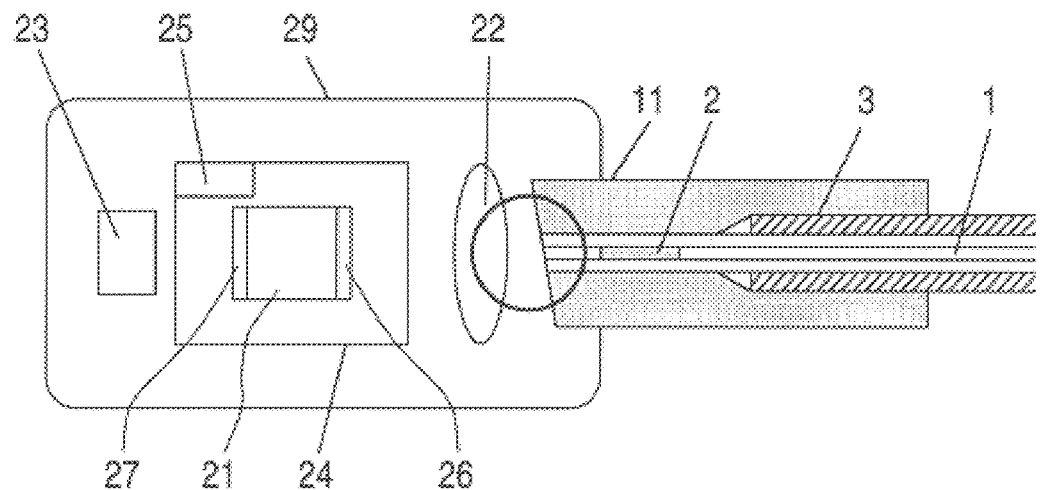
FIG. 5A is a diagram showing the relationship between the top end portion of the optical fiber and a lens in the state where the optical fiber has been connected to the laser oscillating device.
Figure 5B:
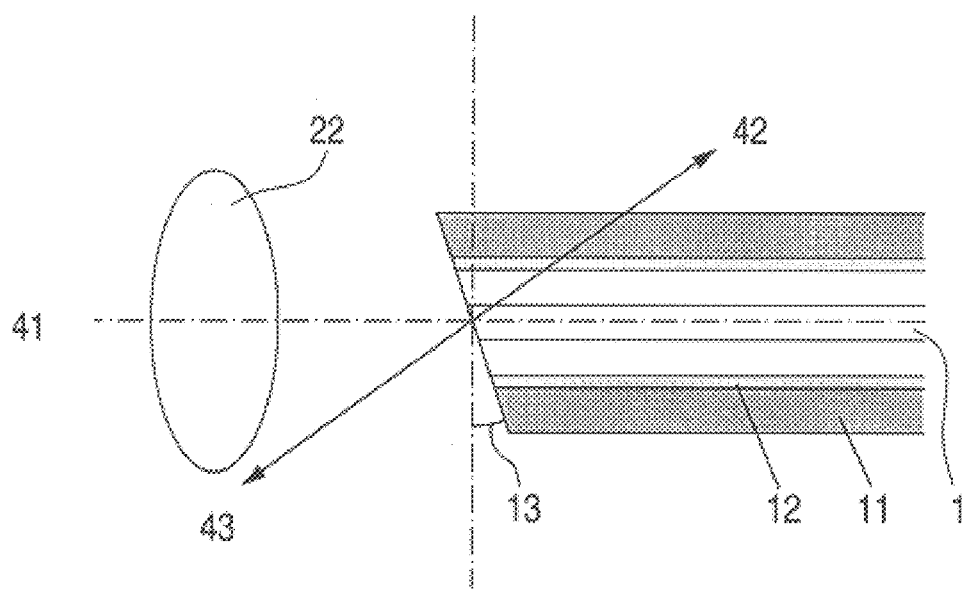
FIG. 5B is an enlarged view of the inside of the circular frame of FIG. 5A, showing the inclination angle of the end surface of the optical fiber containing the diffraction grating and inserted into the ferrule, and the movement direction of light reflected on the ferrule end surface in that case.

A second embodiment will be described. FIG. 5A shows the relationship between a top end portion of an optical fiber inserted into a ferrule and a lens in the state where the optical fiber has been connected to a laser oscillating device. FIG. 5B is an enlarged view of the region about and inside of the circular frame of FIG. 5A, showing the inclination angle of the end surface of the optical fiber containing a diffraction grating and inserted into the ferrule, and the movement direction of light reflected on the ferrule end surface in that case.

Although the direction of the end surface of the top end portion of the ferrule is perpendicular to the optical axis of the optical fiber in the first embodiment, an inclination angle 13 of 8° relative to the diction perpendicular to the optical axis-is provided in this embodiment.

In the laser light source according to the present invention, an oscillator is constituted by a back facet 27 of a semiconductor laser 21 and an optical fiber type diffraction grating 2. Accordingly, noises are caused by light being reflected from the optical fiber type diffraction grating, reflected on the optical fiber end surface and returned to the diffraction grating again, or light being emitted from the semiconductor laser 21, reflected on the optical fiber end surface and returned to the semiconductor laser 21 again.

Therefore, the inclination 13 as mentioned above is provided so as to reflect the reflected light 42 and 43 toward the outside of the resonance system to thereby eliminate the cause of noise. For example, the result of measuring the reflected light 42 to the inside of the optical fiber was not more than −65 dB. It is possible to reduce the cause of noise to the level which has no problem as a laser light source by providing the inclination 13.

On the other hand, if the angle of the inclination 13 is too large, there arises a disadvantage insofar as the amount of lost light is increased. It is therefore necessary to set the inclination to about not larger than 20°, preferably within the range from 5° to 15°.

What is claimed is:

1. A method of manufacturing a laser light source comprising the steps of:

providing an optical fiber, with a portion of the optical fiber having a diffraction grating in which a plurality of refractive index changing portions are formed along the direction of an optical axis of the optical fiber;

providing a laser oscillating device;

inserting the optical fiber having the diffraction grating into a ferrule configured to connect the optical fiber to said laser oscillating device, and fixing the portion of the optical fiber having the diffraction grating to the ferrule; and connecting the laser oscillating device to the optical fiber having the diffraction grating after the portion of the optical fiber having the diffraction grating has been inserted into and fixed to the ferrule.

2. A method according to claim 1, wherein the laser oscillating device comprises a back facet and an output facet, the output facet having a reflection factor which is lower than that of the back facet.

3. A method according to claim 1, further comprising grinding the end surface of the ferrule to form a ground surface, wherein the ground surface of the ferrule in which the optical fiber having the diffraction grating is inserted defines an angle in a range of 0° to 20° relative to a direction perpendicular to the optical axis of the optical fiber.

4. A method according to claim 3, wherein the ground surface of the ferrule in which the optical fiber having the diffraction grating is inserted defines an angle in a range of 5° to 15° relative to the direction perpendicular to the optical axis of the optical fiber.

5. A method according to claim 1, further comprising the step of re-coating at least a portion of the optical fiber having the diffraction grating to be inserted into the ferrule with resin coating.

6. A method according to claim 1, further comprising measuring output light and wavelength characteristics at an emission end of the optical fiber having the diffraction grating and inserted into the ferrule during said connecting step.

7. A method according to claim 1, wherein said step of providing an optical fiber comprises radiating coherent interference fringes of ultraviolet rays onto an optical fiber containing germanium oxide to form refractive index changing portions in which the refractive index changes periodically in the direction of the optical axis.

8. A method according to claim 7, wherein the refractive index changing portions satisfy an expression of $\lambda_b=2n\Lambda$, where $\lambda_b$ is Bragg wavelength, n is an effective refractive index of an optical fiber, and $\Lambda$ is a period of the refractive index changing portions.

9. A method according to claim 1, further comprising the step of coating resin on an outer surface of the optical fiber except at a portion of the outer surface having the diffraction grating.

10. A method according to claim 1, wherein said fixing step comprises bonding the optical fiber to the ferrule with a bonding agent.

11. A laser light source produced by a method comprising the following steps:
   providing an optical fiber, with a portion of the optical fiber having a diffraction grating in which a plurality of refractive index changing portions are formed along the direction of an optical axis of the optical fiber;
   providing a laser oscillating device;
   inserting an optical fiber having the diffraction grating into a ferrule configured to connect the optical fiber to said laser oscillating device, and fixing the portion of the optical fiber having the diffraction grating to the ferrule; and
   connecting the laser oscillating device to the optical fiber with the portion having the diffraction grating inserted in and fixed to the ferrule.

12. An optical ferrule combination comprising an optical ferrule configured to connect an optical fiber to a laser oscillating device and an optical fiber inserted into and fixed to the ferrule, the optical fiber having a portion with a diffraction grating which is formed in the optical fiber before the portion of the optical fiber with the diffraction grating is inserted into and fixed to the ferrule, the diffraction grating comprising a plurality of refractive index changing portions formed along the direction of an optical axis of the optical fiber, wherein the portion of the optical fiber with the diffraction grating is inserted into and fixed to the ferrule before the optical fiber is connected to a laser oscillating device.

13. An optical ferrule combination according to claim 12, further comprising an adhesive disposed between the optical fiber and an inside face of the ferrule to bond the optical fiber to the ferrule.

14. An optical ferrule combination according to claim 12, wherein said diffraction grating is provided at the top end portion of the optical fiber.

15. An optical ferrule combination according to claim 12, wherein an end face of the ferrule in which the optical fiber is inserted defines an inclination in a range of 0° to 20° relative to a direction perpendicular to the optical axis of the optical fiber.

16. An optical ferrule combination comprising an optical ferrule configured to connect an optical fiber to a laser oscillating device and an optical fiber inserted into and fixed to the ferrule, the optical fiber having a portion with a diffraction grating which is formed in the optical fiber before the portion of the optical fiber with the diffraction grating is inserted into and fixed to the ferrule, the diffraction grating comprising a plurality of refractive index changing portions formed along the direction of an optical axis of the optical fiber, wherein the portion of the optical fiber with the diffraction grating is inserted into and fixed to the ferrule.

17. An optical ferrule combination according to claim 16, further comprising an adhesive disposed between the optical fiber and an inside face of the ferrule to bond the optical fiber to the ferrule.

18. An optical ferrule combination according to claim 16, wherein the diffraction grating is provided at the top end portion of the optical fiber.

19. An optical fiber combination according to claim 16, wherein an end face of the ferrule in which the optical fiber is inserted defines an inclination in a range of 0° to 20° relative to a direction perpendicular to the optical axis of the optical fiber.

* * * * *